United States Patent [19]

Ema

[11] Patent Number: 5,396,451
[45] Date of Patent: Mar. 7, 1995

[54] DRAM DEVICE HAVING CELLS STAGGERED ALONG ADJACENT ROWS AND SOURCES AND DRAINS ALIGNED IN A COLUMN DIRECTION

[75] Inventor: Taiji Ema, Kawasaki, Japan

[73] Assignee: Fujitsu Limited, Kawasaki, Japan

[21] Appl. No.: 267,224

[22] Filed: Jul. 5, 1994

Related U.S. Application Data

[63] Continuation of Ser. No. 82,161, Jun. 28, 1993, abandoned, which is a continuation of Ser. No. 759,147, Sep. 11, 1991, abandoned, which is a continuation of Ser. No. 408,025, Sep. 15, 1989, abandoned.

[30] Foreign Application Priority Data

Sep. 19, 1988 [JP] Japan .................. 63-232232

[51] Int. Cl.$^6$ .................. G11C 5/02; G11C 5/06; G11C 11/24
[52] U.S. Cl. .................. 365/51; 365/63; 365/72; 365/149
[58] Field of Search .................. 365/51, 63, 72, 149

[56] References Cited

U.S. PATENT DOCUMENTS

| | | | |
|---|---|---|---|
| 4,319,342 | 3/1982 | Scheuerlein | 365/72 |
| 4,641,166 | 2/1987 | Takemae et al. | 257/306 |
| 4,649,406 | 3/1987 | Takemae et al. | 257/306 |
| 4,651,183 | 3/1987 | Lange et al. | 257/296 |
| 4,689,770 | 8/1987 | Miyamoto et al. | 365/51 |
| 4,742,018 | 5/1988 | Kimura et al. | 437/48 |
| 4,903,344 | 2/1990 | Inoue | 365/51 |
| 4,974,040 | 11/1990 | Taguchi et al. | 257/306 |
| 5,071,783 | 12/1991 | Taguchi et al. | 437/52 |

FOREIGN PATENT DOCUMENTS

| | | |
|---|---|---|
| 0112670 | 7/1984 | European Pat. Off. |
| 0191612 | 8/1986 | European Pat. Off. |
| 0239225 | 9/1987 | European Pat. Off. |
| 63-86186 | 4/1988 | Japan |
| 63-313854 | 12/1988 | Japan |
| 1-147857 | 6/1989 | Japan |
| 1-154549 | 6/1989 | Japan |

OTHER PUBLICATIONS

Takemae et al, Nikkei Electronics, No. 370, Jun. 3, 1985, pp. 209–231.

Primary Examiner—Jack B. Harvey
Assistant Examiner—Michael A. Whitfield
Attorney, Agent, or Firm—Armstrong, Westerman, Hattori, McLeland & Naughton

[57] ABSTRACT

A dynamic random access memory (DRAM) device includes: a plurality of sense amplifiers; bit lines connected to the amplifiers, respectively; a first group of memory cells arranged in a row and connected to one of the bit lines; and a second group of memory cells arranged in a row and connected to the same bit line; the first and second groups being arranged side by side and adjacently to each other, shifted one from the other by a half of a memory cell pitch, and connected alternately to each other in an open bit line system.

3 Claims, 12 Drawing Sheets

DRAM DEVICE HAVING CELLS STAGGERED ALONG ADJACENT ROWS AND SOURCES AND DRAINS ALIGNED IN A COLUMN DIRECTION

This application is a continuation of application Ser. No. 08/082,161, filed Jun. 28, 1993, now abandoned, which is a continuation of application Ser. No. 07/759,147, filed Sep. 11, 1991, now abandoned, which is a continuation of patent application Ser. No. 07/408,025, filed Sep. 15, 1989, now abandoned.

BACKGROUND OF THE INVENTION

1. Field of the Invention

The present invention relates to a semiconductor memory device, and more particularly, to a dynamic random access memory (DRAM) device.

2. Description of the Related Art

Currently, memory cells each comprising one-transistor and one-capacitor of a DRAM device are further integrated to produce 4 megabit (M) DRAM's and samples of 16M DRAMs.

As the integration degree of the DRAMs is increased, however, the power consumption is greatly increased, and therefore, it is necessary to solve problems that arise due to this large power consumption. For example, a high heat radiation due to the large power consumption exceeds the capacity therefor of a conventional standard package, and thus this heat radiation must be reduced by improving circuit designs by reducing the size of memory cells, and by lowering a parasitic capacitance of a bit line, or the like. Furthermore, the high integration density of DRAM's allows a miniaturization of the memory cells and the DRAM device, which leads to a lowering of the capacitance of a charge storage capacitor, and this lowering of the capacitance leads to an increase of soft errors caused by an incidence of α-rays. Therefore, preferably the size of the charge storage capacitor is reduced without lowering the capacitance thereof.

Various improved DRAM devices are available; for example, in addition to an open bit line system, a folded bit line system by which the S/N (signal-to-noise ratio) is improved has been proposed, and with regard to the charge storage capacitor of a memory cell, in addition to a usual three dimensional stacked capacitor comprising a lower polycrystalline silicon (poly Si) electrode layer, an upper poly Si electrode layer, and a dielectric film sandwiched between the electrode layers, a tree-like multilayer stacked capacitor having a very high capacitance has been proposed.

Each of the memory cells of a DRAM device comprises a transfer transistor (MOS FET) T and a charge storage capacitor C arranged in a circuit as shown in FIG. 1. This circuit is used in both the open bit line system DRAM and the folded bit line system DRAM. The transistor T comprises a gate electrode 4 (i.e., a word line WL1), a source region 5 of a bit line contact region, and a drain region b of a storage electrode contact region, and the charge storage capacitor C comprises a storage electrode 8, a dielectric film (thin layer) 9, and an opposite electrode 10.

The open bit line system DRAM with a usual three-dimensional stacked capacitor has an arrangement (layout) as shown in FIG. 2. In FIG. 2, the same elements as shown in FIG. 1 are denoted by the same reference numerals and symbols. In this case, the word lines WL1 (4) and WL2 are made of poly Si, and the source region 5 and the drain region 6 are n+-type impurity-doped regions. Reference numerals "7A" and "7B" indicate a bit line contact window and a storage electrode contact window, respectively, and are formed in an insulating layer. The storage electrode 8 of the capacitor C is made of poly Si and extends above the word line WL1 (4). The opposite electrode 10 is also made of poly Si and the bit line BL (12) is made of a conductor such as aluminum and metal silicide (e.g., $WSi_2$). FIG. 2 has two additional scales at a right hand side and a lower side thereof, in which "a", "b" and "c" indicate a minimum line width, a first alignment tolerance, and a second alignment tolerance, and are used for a comparison of the memory cell size (area) as explained hereafter in detail.

The open bit line system DRAM device has been replaced by a folded bit line system DRAM device developed to increase the S/N.

The folded bit line system DRAM device with a usual three-dimensional stacked capacitor is shown in FIG. 3 and 4; (for example, cf. Takemae et al, "Development of 1M DRAM for Aiming at Easy Operation and Production", Nikkei Electronics, No. 370, Jun. 3, 1985, PP. 209–231). FIG. 3 shows a layout (a schematic partial plan view) of the DRAM device and FIG. 4 shows a schematic sectional partial view of the device taken along the line IV—IV of FIG. 3. Note, in these drawings, the same or corresponding elements as those shown in the previous figures are denoted by the same reference numerals and symbols.

The DRAM device is produced by using a p-type silicon substrate (wafer) 1, and is provided with a field insulating film 2 of silicon dioxide ($SiO_2$) a gate insulating film 3 of $SiO_2$, an insulating interlayer (film) 7 of $SiO_2$, and an insulating interlayer (film) 11 of phosphosilicate glass (PSG). The stacked capacitor consists of the storage (lower) electrode 8 of poly Si, the dielectric film 9 of $SiO_2$, and the opposite (upper) electrode 10 of poly Si. Since the storage electrode 8 extends above the word lines WL1 and WL2, the capacitance of the capacitor is increased, and as an electric charge stored in the capacitor of a memory cell corresponds to memory information, as the capacitance of the capacitor is increased, the S/N is improved.

Nevertheless, the miniaturization of DRAMs means that the size of the charge storage capacitor is reduced, and thus there is a possibility of a shortage of the capacitance. Accordingly, a tree-like multilayer stacked capacitor, in which the capacitance (electric charge storing ability) is greatly increased, has been proposed (for example, U.S. Ser. No. 07/206,791 filed on Jun. 15, 1988, now abandoned, and Japanese Patent Application Nos. 62-149143, 62-30641 and 62-314764).

FIG. 5 shows a schematic sectional view of the DRAM device with the tree-like multilayer stacked capacitor, in which drawing the same or corresponding elements as those shown in the previous figures are denoted by the same reference numerals and symbols. As can be seen from FIG. 5, the capacitor consisting of the storage electrode 8, the dielectric film 9 and the opposite electrode 11 has three fin portions 15, 17, and 19, and thus the capacitance thereof is much larger than that of the capacitor of FIG. 4, and as long as such a tree-like stacked capacitor structure is adopted in DRAM devices, the capacitance thereof will allow a further miniaturization of DRAMs, to produce, for example, 16M DRAMs.

Nevertheless, this increase of capacitance due to the tree-like structure causes problems in the production process. Namely, the height of the charge storage capacitance is increased to make a distance between the substrate surface and the top surface of the insulating film 11 greater, which results in a poor step coverage of the bit line 12, regardless of FIG. 5.

The problem (i.e., poor step coverage) had been solved by an improved DRAM device shown in FIGS. 6 and 7, in which the bit line 12 is formed prior to the formation of the tree-like capacitor. FIG. 6 shows a schematic sectional partial view of the improved DRAM device and FIG. 7 shows a layout (a schematic partial plan view) of the device, in which drawings the same or corresponding elements as those shown in the previous figures are denoted by the same reference numerals and symbols. In FIG. 6, the bit line 12 has a doublelayer structure of a poly Si film and a WSi$_2$ film, and an additional insulating interlayer 13 of silicon nitride (Si$_3$N$_4$) is formed to cover the bit line 12 and the insulating interlayer 7. The tree-like stacked capacitor of the improved DRAM device is the same as that shown in FIG. 5, except for the shape of the opposite electrode 10. FIG. 7 has additional scales similar to those of FIG. 2 at the right hand side and lower side thereof, and these are used for a comparison of the memory cell size (area). When the bit line 12 is formed, since a large step (tree-like structure) does not exist, the step coverage problem is avoided. Furthermore, the fin portions 15, 17 and 19 of the capacitor (FIG. 6) can be further extended above the bit line 12 and beyond the word line WL1 (gate electrode 4), so that the capacitance is further increased.

Where the technique of the improved DRAM device of FIGS. 6 and 7 is applied to an open bit line system DRAM device, a layout (arrangement) of the latter device is obtained as shown in FIG. 8. This layout was formed by the present inventor during experiments in the making of the present invention. In FIG. 8, the same elements as those shown in FIGS. 6 and 7 are denoted by the same reference numerals and symbols, and an additional two scales similar to those of FIGS. 2 and 7 are also shown in FIG. 8.

Although the folded bit line system having an improved S/N is superior to the open bit line system, the tree-like multilayer stacked capacitor provides a capacitance sufficient to obtain a good S/N, in spite of miniaturization, with the result that the open bit line system is preferable since the bit line (parasitic) capacitance is lower than that of the folded bit line system, whereby an output signal voltage is increased and the power consumption is reduced.

The parasitic capacitance of the bit line will be explained.

When the word line WL1 (4) is ON, the following formula is obtained:

$$C_{BL}V_0 + C_{cell}V_1 = (C_{BL} + C_{cell})V$$

where, $C_{cell}$ is the capacitance of the charge storage capacitor described with reference to FIGS. 1 to 8, $C_{BL}$ is the parasitic capacitance of the bit line BL (12), $V_0$ is an initial bit line voltage, $V_1$ is a voltage of the capacitor, and V is a voltage of the word line WL 1 in an ON condition.

The output signal voltage $\Delta V$ is as follows:

$$\Delta V = V - V_0 = \frac{C_{cell}(V_1 - V_0)}{C_{BL} + C_{cell}}$$

$$= \frac{V_1 - V_0}{1 + C} \left( C = \frac{C_{BL}}{C_{cell}} \right)$$

and thus is largely dependent upon a ratio of the bit line capacitance $C_{BL}$ to the capacitor's capacitance $C_{cell}$. Therefore, preferably the bit line capacitance is made as low as possible.

In the operation of the DRAM device, to prevent a loss of information, a refresh, i.e., reading and rewriting, operation is periodically carried out at predetermined intervals. When rewriting, the charge storage capacitor must be made high ("H") level by charging up the bit line to the supply (source) voltage. This charge up electric current accounts for about half of the total power consumption. The charge up and discharge electric current is proportional to the bit line capacitance, and thus preferably the bit line capacitance is lowered.

The simplest and most certain means of lowering the bit line parasitic capacitance is to shorten the bit line length.

The bit line length of the folded bit line system DRAM device of FIGS. 6 and 7 is explained with reference to FIG. 9. FIG. 9 schematically shows a relationship between bit lines BL1A, BL1B, BL2A, BL2B, memory cells MC, and sense amplifiers SA1, SA2. In this case, a pair of memory cells MC constitute a unit cell. The length of each of the bit lines BL1A . . . is relatively long, and thus the bit line parasitic capacitance is high. For example, where a sense amplifier SA is provided with 512 memory cells, although 256 cells per bit line exist, there are 512 word lines per bit line. Namely, 512 word lines cross a bit line, and thus the bit line length corresponds to at least the total pitch of 512 word lines.

Further, in addition to the high bit line parasitic capacitance in the above-mentioned folded bit line system DRAM devices, these devices and the open bit system DRAM device of FIG. 8 have a problem of memory cell size (area).

Prior to a discussion of the cell sizes of the DRAM devices of FIGS. 7, 2 and 8, the first and second alignment tolerances "b" and "c" shown in the additional scales of the drawings are explained with reference to FIGS. 10A, 10B, 11A and 11B. In the drawings, reference numerals 31, 32, 33, 34 and 35 indicate a silicon substrate, an insulating film of SiO$_2$, a poly Si electrode, another (e.g., gate) insulating film, and another (e.g., gate) electrode of poly Si, respectively.

FIGS. 10A and 10B explain the formation of the first alignment tolerance "b". The size of the poly Si electrode 33 must be larger than a contact window size by at least the alignment tolerance "b", as shown in FIG. 10A. If the poly Si electrode 33 is patterned to form a space between the electrode 33 and the insulating film 32, as shown in FIG. 10B, a portion of the silicon substrate 31 is etched at the patterning step.

FIGS. 11A and 11B explain the formation of the second alignment tolerance "c". To bring the poly Si electrode 33 into appropriate contact with the silicon substrate 31, the insulating film 32 must be selectively etched to provide the alignment tolerance "c" between a contact window and the gate electrode 35, as shown in FIG. 11A. If the selective etching of the insulating film is not appropriate, as shown in FIG. 11B, a short occurs between the poly Si electrode 33 and the (gate) electrode 35.

Therefore, the following relationship is determined between the minimum line width "a", and the alignment tolerances "b" and "c":

$$a > c > b$$

In general the conditions "a=4b" and "c=2b" are predetermined.

Taking the above-mentioned explanation and conditions into consideration, the memory cell size of the DRAM device of FIG. 7 is calculated as follows:

$$\text{Cell size} = 2(a + c) \times (4a + 3c)$$
$$= 264b^2$$

This cell size is relatively large, and if the memory cell size can be further reduced without affecting the properties and functions of the DRAM device, good results will be obtained together with an even better integration.

The memory cell size of the DRAM device of FIG. 2 is calculated as follows:

$$\text{Cell size} = (3a + b + 2c) \times 2(a + b)$$
$$= 170b^2$$

The memory cell size of the DRAM device of FIG. 8 is calculated as follows:

$$\text{Cell size} = (3a + 2c + b) \times 2(a + b)$$
$$= 204b^2$$

SUMMARY OF THE INVENTION

An object of the present invention is to provide a DRAM device in which a bit line parasitic capacitance thereof is lowered to reduce a power consumption and which is produced by a production process for a conventional folded bit line system DRAM device with a three-dimensional stacked capacitor.

Another object of the present invention is to reduce the size of a memory cell without affecting the properties and functions of the DRAM device.

These and other objects of the present invention are obtained by providing a DRAM device comprising: a sense amplifier; a bit line connected to said sense amplifier; a first group of dynamic memory cells arranged in a row and connected to said bit line; and a second group of dynamic memory cells arranged in a row and connected to said bit line, said first and second groups being arranged side by side and adjacently to each other and one of the groups being shifted from the other in the row direction.

The bit line is extended in a zigzag manner to come into contact with the memory cells of the first and second group alternately in an open bit line system.

Preferably one of the first and second group of memory cells is shifted from the other by a half of the memory cell pitch.

Preferably, the storage capacitor is a tree-like multilayer stacked capacitor.

BRIEF DESCRIPTION OF THE DRAWINGS

The present invention will be more apparent from the description of the preferred embodiments set forth below, with reference to the accompanying drawings, in which.

DETAILED DESCRIPTION OF THE PREFERRED EMBODIMENTS

Figure 12:
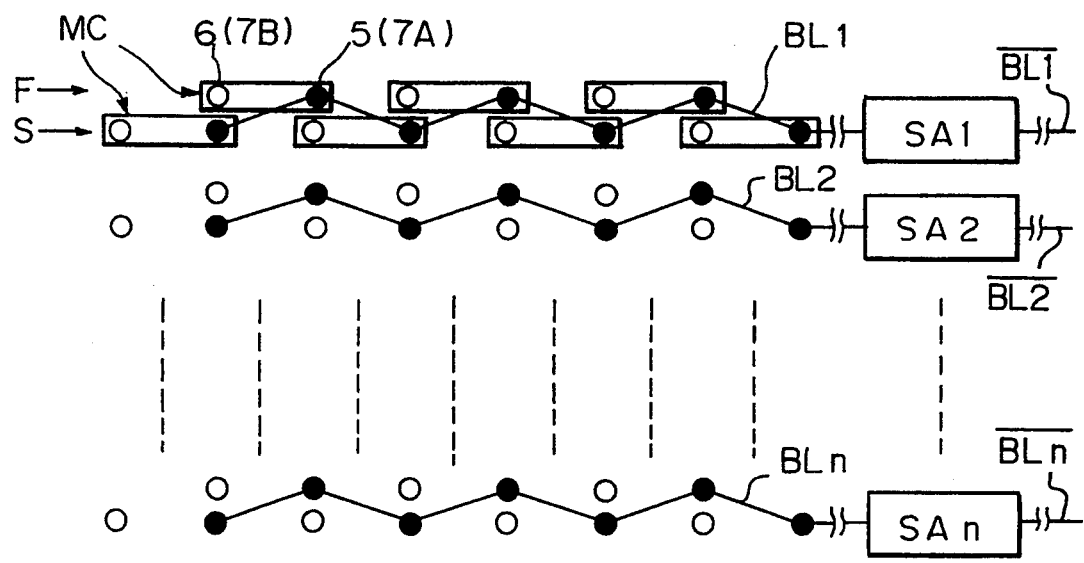
FIG. 12 is a diagram of memory cells, bit lines and sense amplifiers of a DRAM device according to the present invention.
Figure 13:
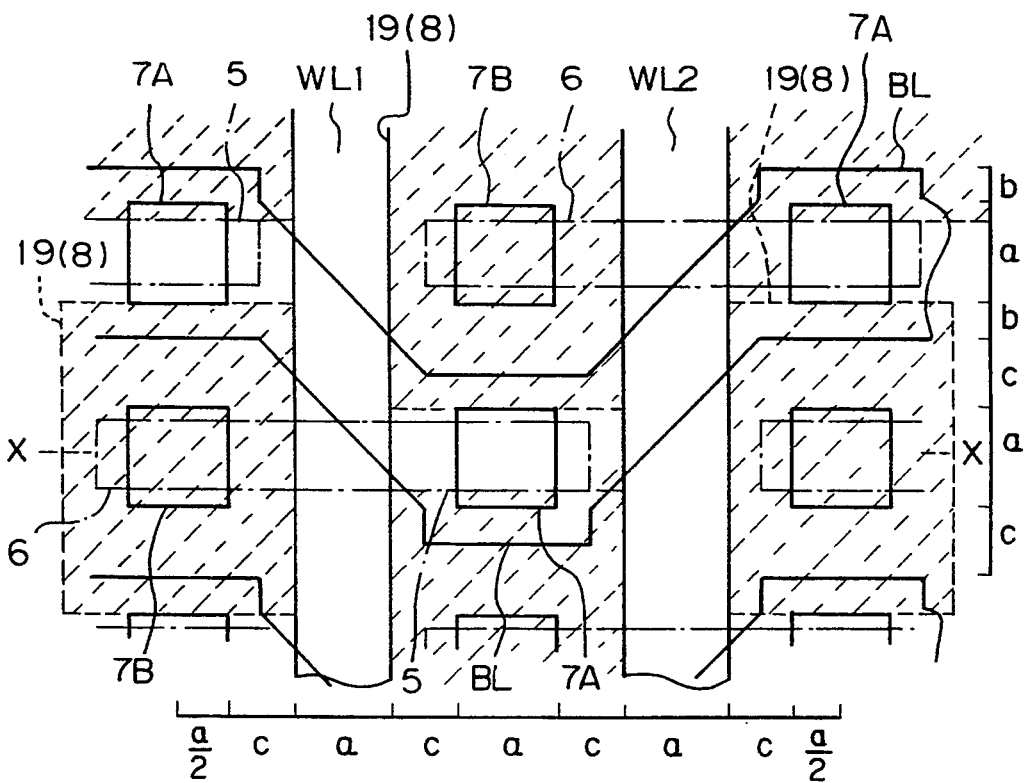
FIG. 13 is a schematic partial plan view (layout) of an open bit system DRAM device according to the present invention.

Referring to FIGS. 12, each individual column unit cell of memory cells MC is connected to each of sense amplifiers SA1, SA2 . . . SAn by one of pairs of bit lines BL1 and BL1, BL2 and BL2, . . . BLn and BLn in the open bit line system. Each of the memory cells MC has a source region 5 (contact window 7A) for contact with the bit line BL1 and a drain region 6 (contact window 7B) for contact with the storage electrode, as explained hereinbefore. According to the present invention, the individual column unit cell is formed of two adjacent unit cell rows (a first group row F and a second group row S) of memory cells MC arranged to shift one of the rows from the other by a half of the memory cell pitch in the column direction, as shown in FIGS. 12 and 13. FIG. 13 corresponds to a portion of FIG. 12, and shows word lines WL1 and WL2 and the storage electrode 19(8) of the tree-like multilayer stacked capacitor, which are omitted in FIG. 12. The bit line BL runs in a zigzag fashion and connects the source regions 5 of all of the memory cells MC of the individual column unit cell in series and in alternate unit cell rows.

Hereafter, reference to the direction of the bit line indicates the column direction, and reference to the direction of the spacing of the memory cells corresponding to the dominant direction of traversal of the bit lines is referred to as the row direction.

Since the DRAM device according to the present invention adopts the open bit line system in which one bit line connects the memory cells arranged in two adjacent unit cell rows shifted by a half of the memory cell pitch from each other, the length of the bit line is about half that in the folded bit line system, so that the parasitic capacitance of the bit line is about half that of the folded bit line system. For example, where a sense amplifier SA is provided with 512 memory cells, 256 cells per bit line exist and there are 256 word lines. Thus 256 word lines cross a bit line, so that the bit line length corresponds to at least the total pitch of 256 word lines and an additional length due to a zigzag line. As a result, the power consumption caused by the bit line capacitance is reduced by about half and the output signal voltage is almost doubled compared with the folded bit line system DRAM device.

Furthermore, the number of bit lines on one side of the sense amplifiers in the open bit line system DRAM device is half that in the folded bit line system DRAM device. Therefore, it is possible to increase the bit line pitch to prevent a short circuit between the bit lines, to increase the width of isolation of the memory cells from each other to prevent a short circuit between the source and drain regions of the MOS FET and those of another MOS FET, and to reduce the sizes of the source and drain regions to reduce the probability of incident radiant rays such as $\alpha$-rays, so that the number of $\alpha$-particle-induced soft errors is reduced.

According to the present invention, the size (area) of a memory cell can be further reduced compared with the above-mentioned DRAM devices.

The memory cell size of the DRAM device of FIG. 13 is calculated with reference to two additional scales in a manner similar to that of FIGS. 7, 2 and 8, as follows:

$$\text{Cell size} = 2(a + c) + (2a + 2b + 2c)$$
$$= 168b^2$$

Figure 1:
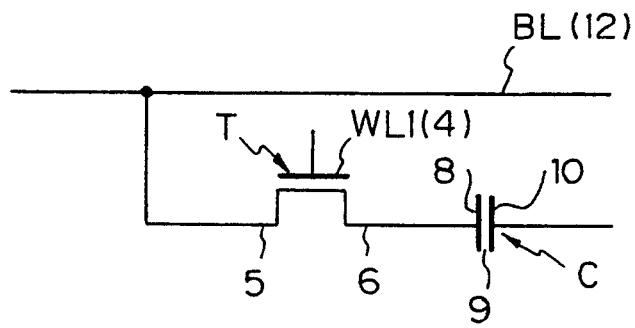
FIG. 1 is a circuit of a memory cell of a prior art DRAM device.
Figure 2:
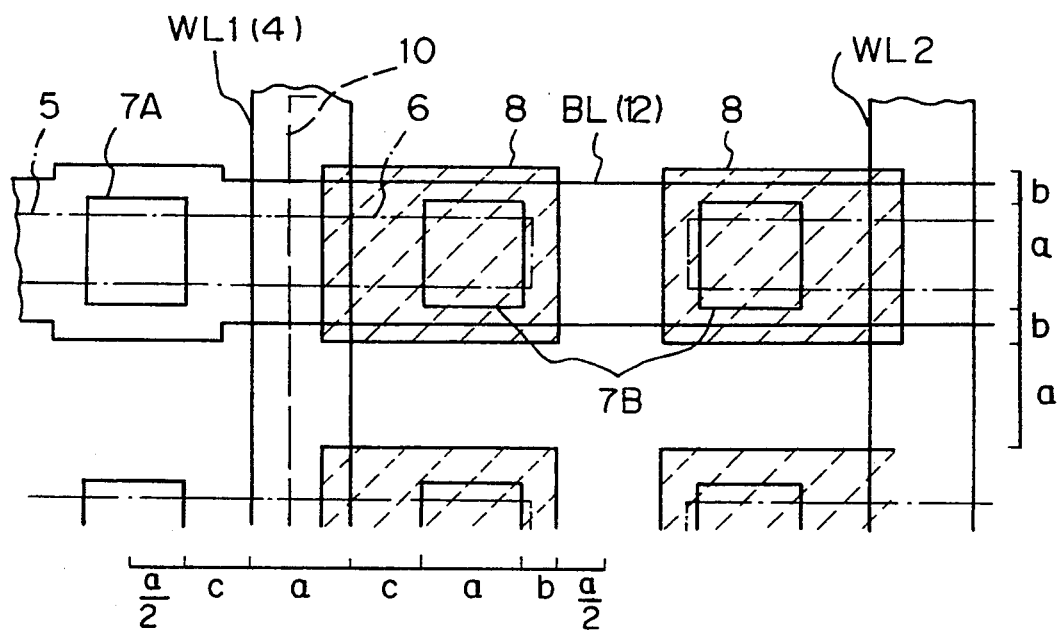
FIG. 2 is a schematic partial plan view (layout) of a conventional open bit line system DRAM device.
Figure 3:
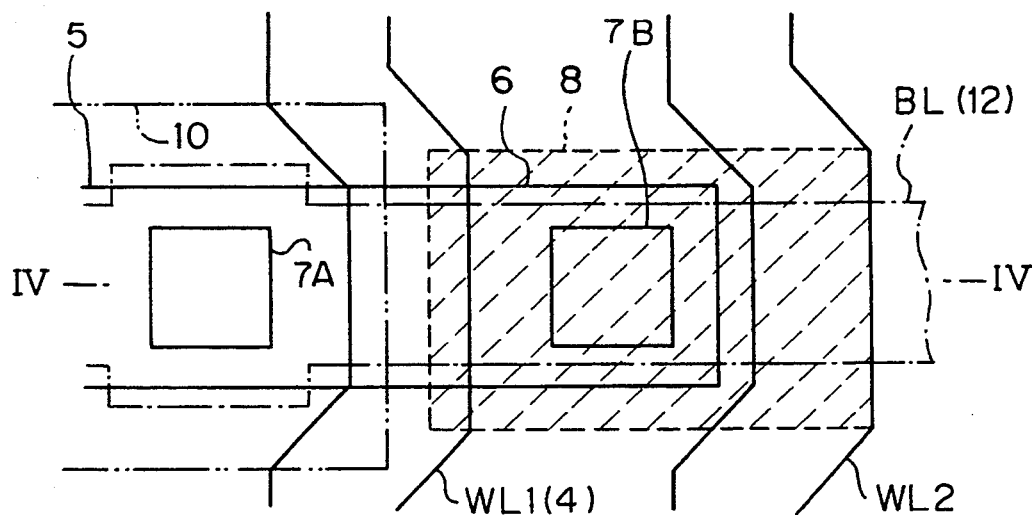
FIG. 3 is a schematic partial plan view (layout) of a conventional folded bit line system DRAM device with a stacked capacitor.
Figure 6:
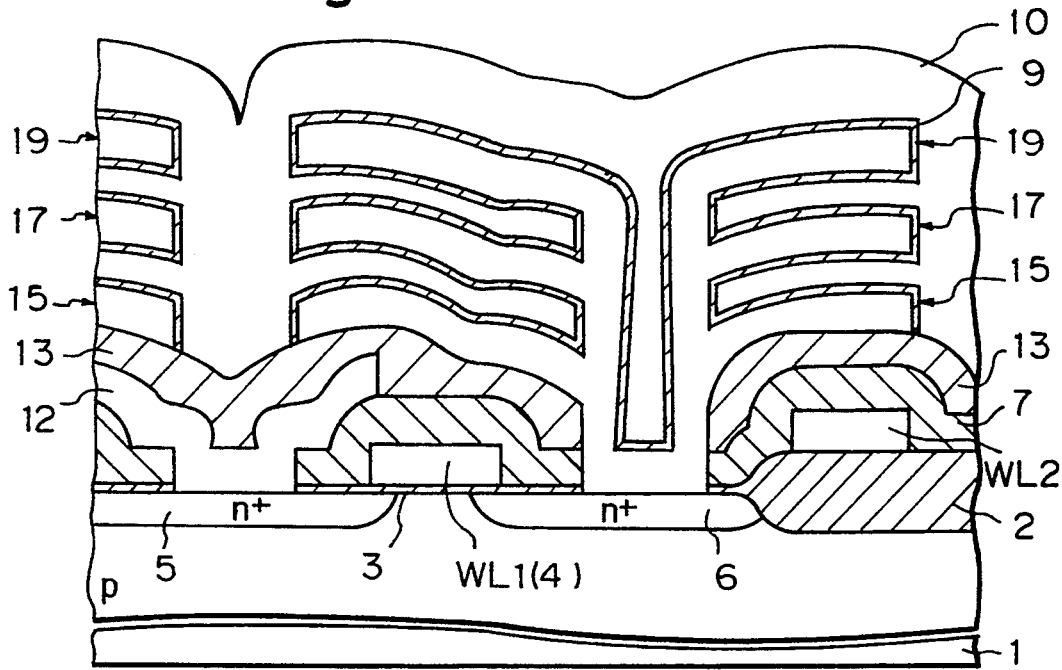
FIG. 6 is a prior art schematic partial sectional of an improved folded bit line system DRAM device.
Figure 7:
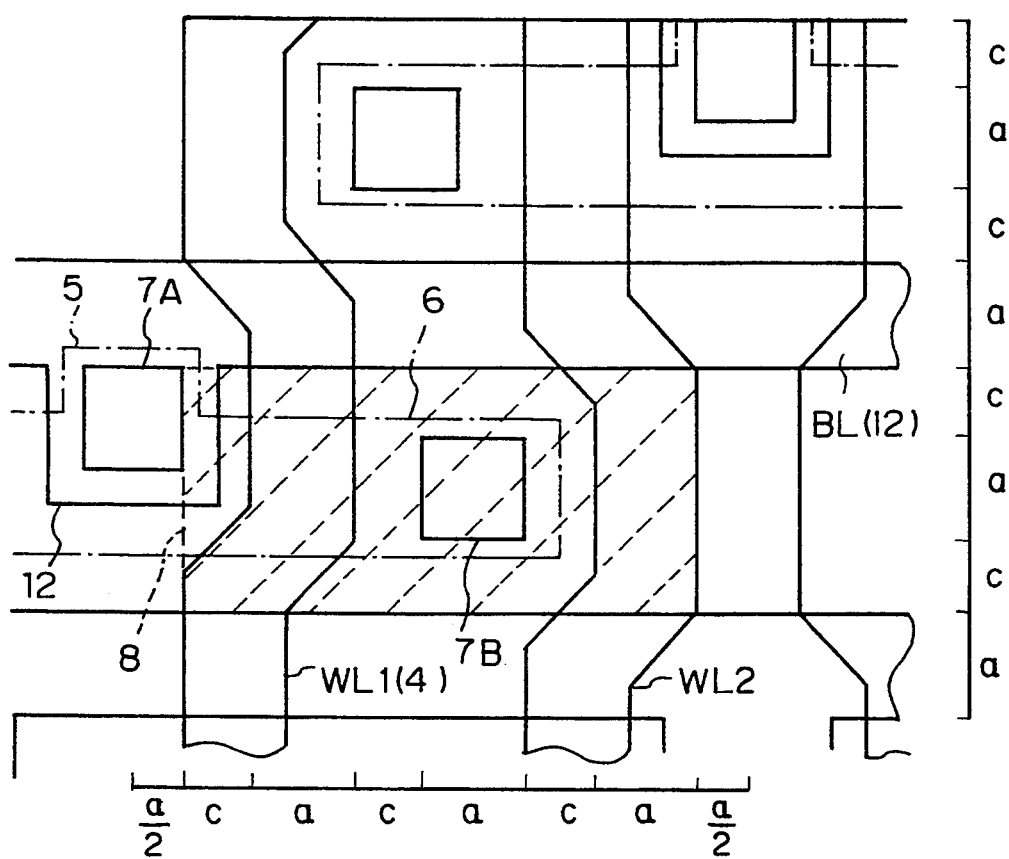
FIG. 7 is a schematic partial plan view (layout) of the prior art DRAM device of FIG. 6.
Figure 8:
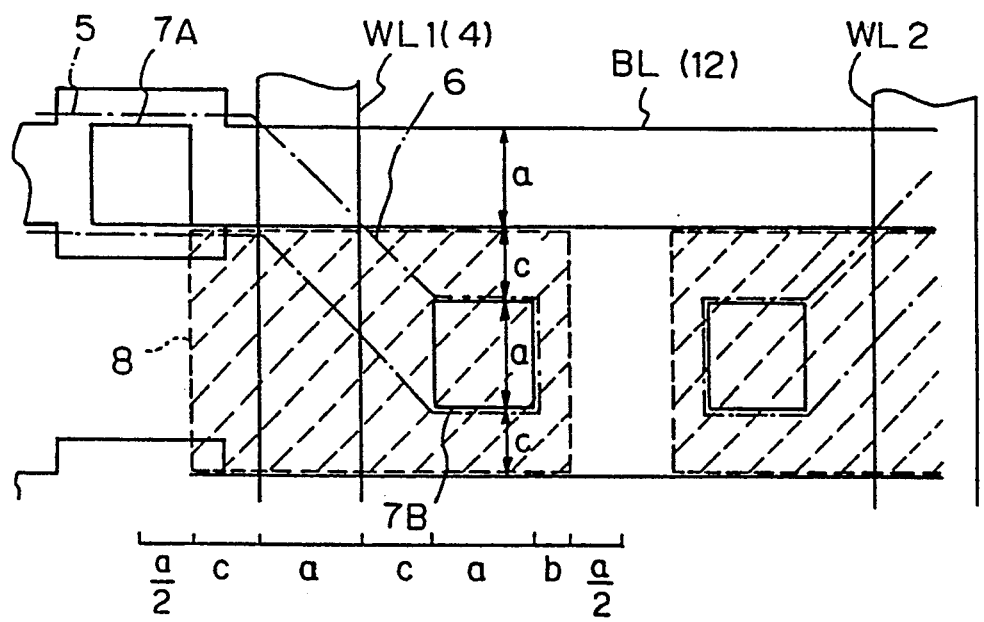
FIG. 8 is a prior art schematic partial plan view (layout) of an open bit line system DRAM device produced by adopting a production process of the DRAM device of FIG. 6.
Figure 9:
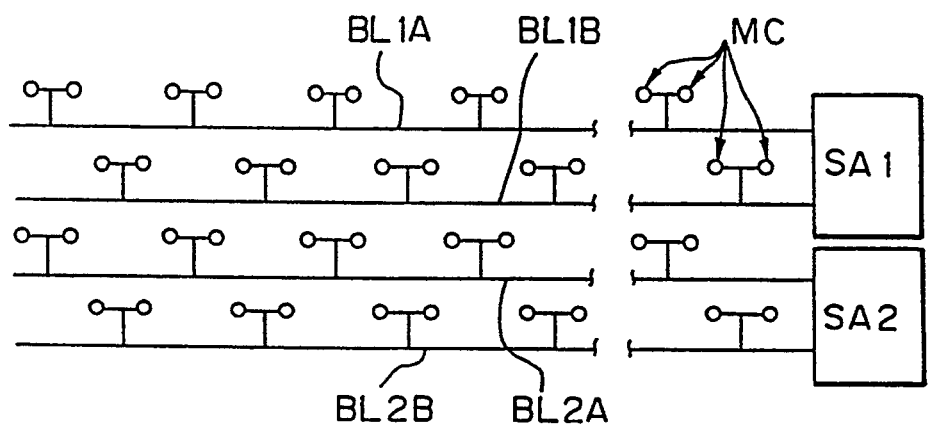
FIG. 9 is a diagram of memory cells, bit lines and sense amplifiers of the prior art DRAM device of FIGS. 6 and 7.
Figure 10A:
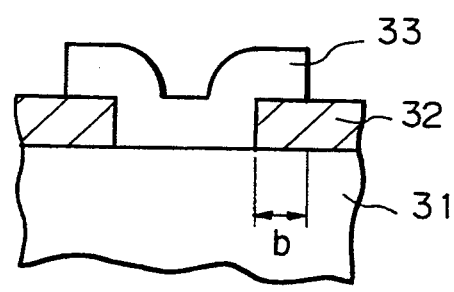
FIGS. 10A and 10B are partially sectional views of a DRAM device, for explaining a first alignment tolerance "b"
Figure 10B:
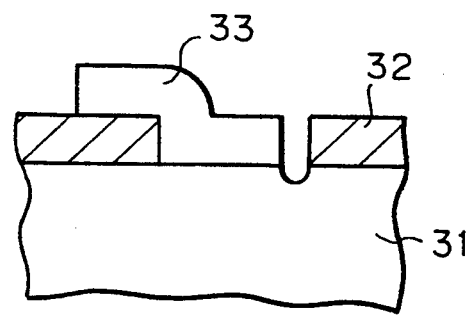
Figure 11A:
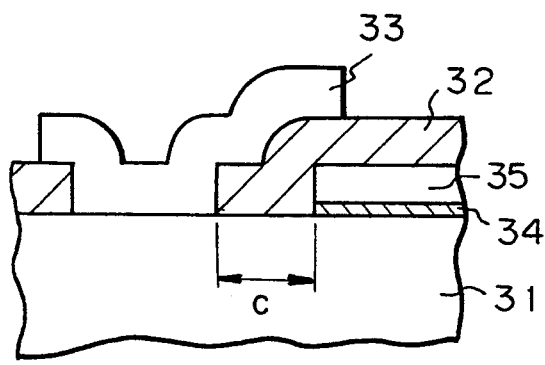
FIGS. 11A and 11B are partially sectional views of a DRAM device, for explaining a second alignment tolerance "c"
Figure 11B:
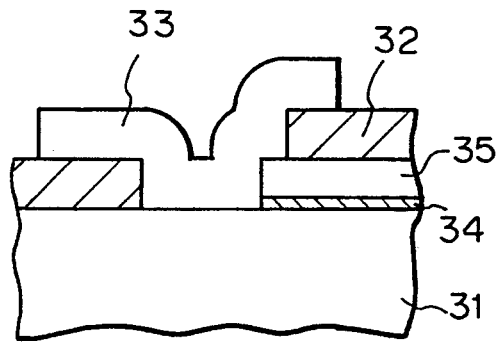

Therefore, where the calculated cell size according to the present invention is compared with each of the cell sizes of FIGS. 7, 2 and 8, the following ratios are obtained:

- a ratio of the cell size (FIG. 13) of present invention device to the cell size (FIG. 7) of folded bit line system DRAM device is 168/264=0.64;
- a ratio of the cell size (FIG. 13) to that (FIG. 2) of the open bit line system DRAM device is 168/170=0.98; and
- a ratio of the cell size (FIG. 13) to that (FIG. 8) of the open bit line system DRAM device adopting the technique used in the improved DRAM device (FIGS. 6 and 7) is 168/204=0.82.

In a comparison with the conventional open bit line system device (FIG. 2), it appears that the cell size reduction is not substantially obtained. Nevertheless, the DRAM device according to the present invention is superior to the conventional DRAM device of FIG. 2, taking into account a bit-line-to-word line pitch ratio. Namely, in the conventional device of FIG. 2, the pitches are as follows:

Bit line pitch $=2(a+b)=10b$

Word line pitch $=3a+2c+b=17b$

But in the device of FIG. 13 according to the present invention, the pitches are as follows:
Bit line pitch $=2(a+b+c)=14b$ Word line pitch $=2(a+c)=12b$ The bit line is connected to a sense amplifier requiring a pair of transistors, whereas the word line is connected to a decoder requiring one transistor. Therefore, preferably the bit line pitch (i.e., sense amplifier pitch) is larger than the word line pitch, since this condition does not waste space in the circumferential circuits, compared with the revised condition such as shown in FIG. 2.

The above-mentioned advantages (effects) of the present invention are due largely to a change of the memory cell layout from the folded bit line system to the open bit line system. The conventional open bit line system DRAM device, however, has a plurality of individual unit cells, in each of which cells memory cells are arranged on one side of a bit line in a straight line, and which cells are not shifted from each other in a straight line direction. Furthermore, the structural arrangement of the memory cells of the conventional DRAM device is different from that of the DRAM device according to the present invention.

A production process of the DRAM device according to the present invention is explained with reference to FIGS. 14A to 14J, in which the same or corresponding elements as those shown in the previous figures are denoted by the same reference numerals and symbols. FIGS. 14A to 14J are views taken along a line X—X in FIG. 13.

Figure 14A:
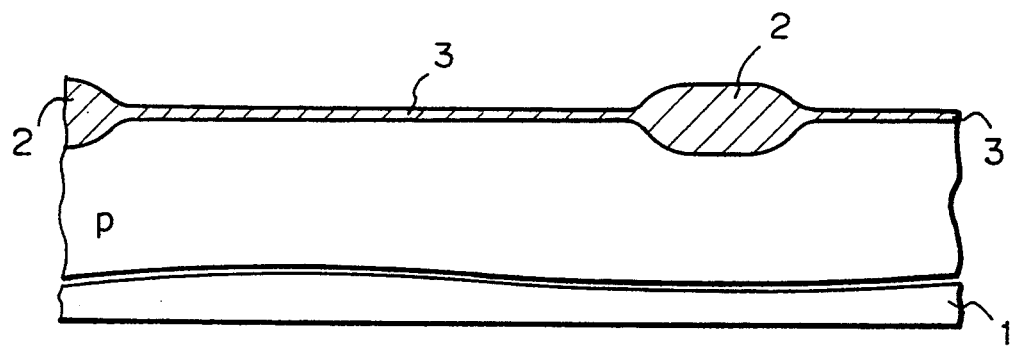
FIGS. 14A to 14J are schematic partial sectional views of the DRAM device according to the present invention, in various stages of the production thereof.

Referring to FIG. 14A:

The p-type silicon substrate 1 is selectively oxidized by a thermal oxidation process using a non-oxidizable mask (not shown) of, e.g., $Si_3N_4$ film, to form the field insulating film 2 of $SiO_2$. The non-oxidizable mask is removed to expose a silicon surface of the substrate 1, and then the silicon substrate 1 is thermally oxidized to form the gate insulating film 3 of $SiO_2$ having a thickness of, e.g., 20 nm, on the exposed surface, so that the silicon substrate 1 is completely covered by the insulating film of $SiO_2$.

Figure 14B:
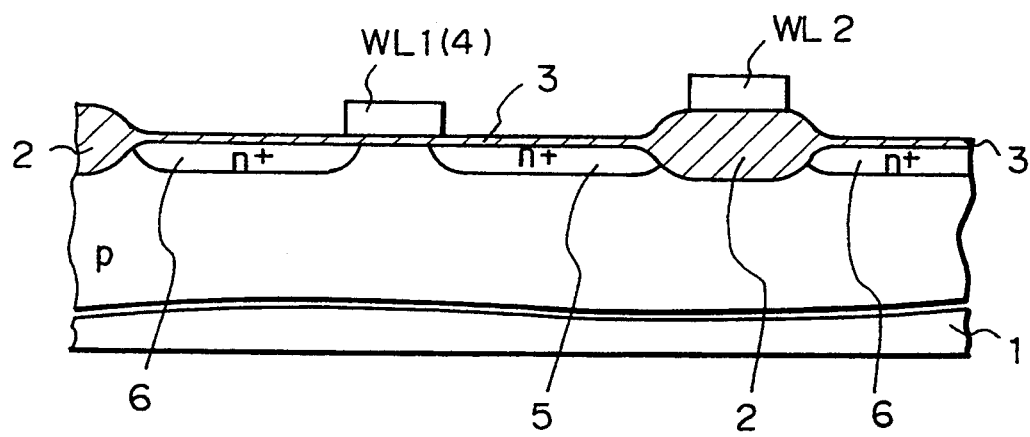

Referring to FIG. 14B:

A poly Si film having a thickness of, e.g., 200 nm is deposited on the whole surface by a chemical vapor deposition (CVD) process, and then impurities (phosphorus: P) are doped into the poly Si film by a thermal diffusion process to give a conductivity to the poly Si film. The poly Si film is patterned (selectively etched) by a conventional photolithography technique including a resist process and a reactive ion etching (RIE) process, to form the word line (gate electrode) WL1(4) and another word line WL2.

Next, donor impurities (arsenic: As) are doped into the silicon substrate 1 by an ion-implantation process using the word lines WL1 and WL2 and the field insulating film 2 as a mask, to form impurity-doped regions 5 and 6. An annealing (heat-treatment) for activation of implanted impurities is carried out to change the regions 5 and 6 into the $n^+$-type source region 5 of a bit line contact region and the $n^+$-type drain region 6 of a storage electrode contact region. In this case, the As ion-implantation is carried out at a dose of, e.g., $4 \times 10^{15}$ cm$^{-2}$, at an acceleration energy of, e.g., 50 keV.

Figure 14C:
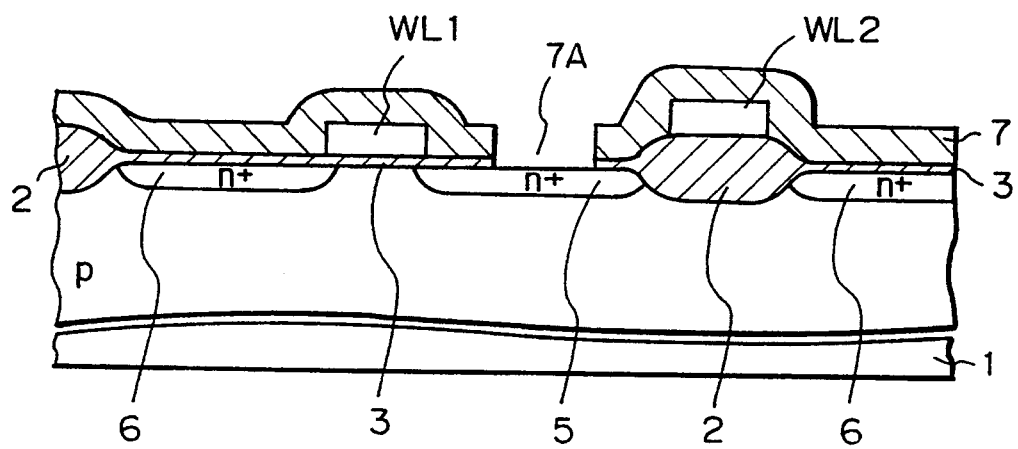

Referring to FIG. 14C:

The insulating interlayer 7 of SiO$_2$ having a thickness of, e.g., 100 nm, is formed on the whole surface by a CVD process. Note, it is possible to use Si$_3$N$_4$ instead of SiO$_2$ for the insulating interlayer 7. The interlayer 7 is selectively etched to form the contact window 7A for the bit line by a conventional photolithography technique including a resist process and a RIE process.

Figure 14D:
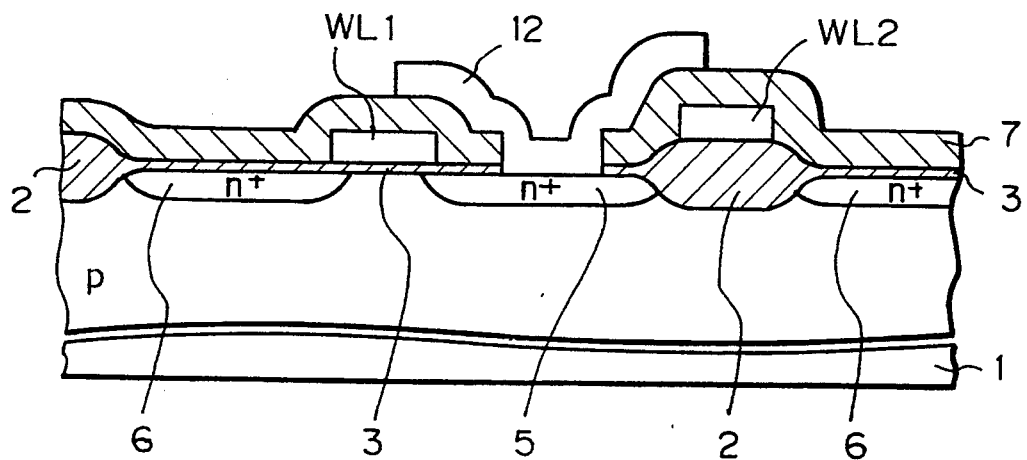

Referring to FIG. 14D:

The poly Si film is deposited on the whole surface by a CVD process and the WSi$_2$ film is deposited on the poly Si film by a CVD process to form a doublelayer film. The WSi$_2$ film and poly Si film are successively patterned (selectively etched) by a conventional photolithography technique including a resist process and a RIE process, to form the bit line 12.

Figure 14E:
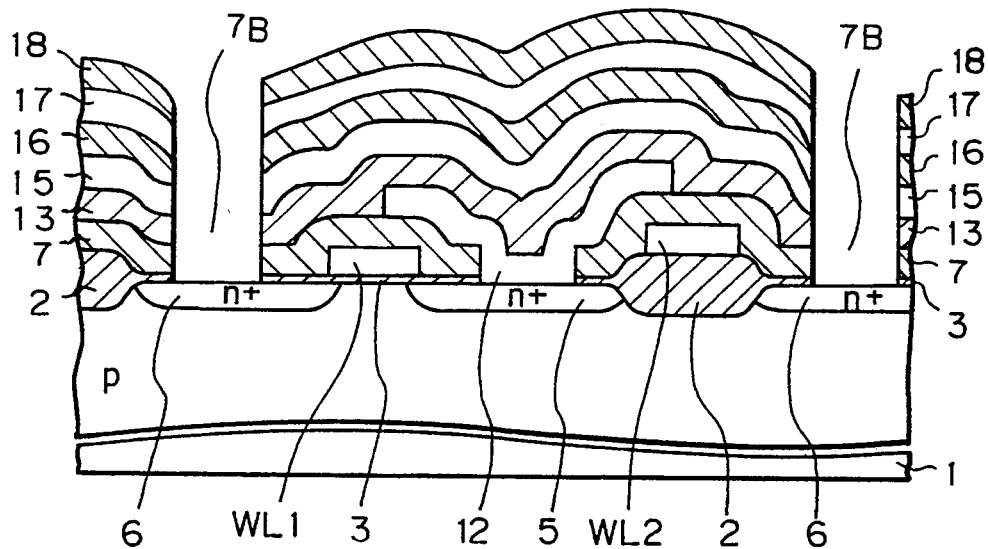

Referring to FIG. 14E:

An insulating interlayer 13 of Si$_3$N$_4$ having a thickness of, e.g., 100 nm is formed on the whole surface by a CVD process.

Then a poly Si film 15 having a thickness of, e.g., 100 nm, is formed on the interlayer 13 by a CVD process, and As impurities are doped into the poly Si film 15 by an ion-implantation process at a dose of $4 \times 10^{15}$ cm$^{-2}$, and an acceleration energy of 50 keV, to give a conductivity to the poly Si film 15. Note, it is possible to form an additional SiO$_2$ film having a thickness of, e.g., 100 nm between the interlayer 13 and the poly Si layer 15.

Next, a SiO$_2$ film 16 having a thickness of, e.g., 100 nm, is formed on the poly Si film 15 by a CVD process, and a poly Si film 17 having a thickness of, e.g., 100 nm is formed on the SiO$_2$ film 17 by a CVD process. Then As impurities are doped into the film 17 by an ion-implantation process at a dose of $4 \times 10^{15}$ cm$^{-2}$, and an acceleration energy of 50 keV.

Furthermore, a SiO$_2$ film 18 having thickness of, e.g., 100 nm, is formed on the poly Si film 17 by a CVD process.

Next, the formed multilayers of the Si$_3$N$_4$ interlayer 13, poly Si films 15 and 17 and SiO$_2$ films 16 and 18 is selectively etched to form the contact windows 7B for the storage electrode, by a conventional photolithography technique including a resist process and a RIE process, and portions of the n+-type drain regions 6 are exposed in the windows 7B.

Figure 14F:
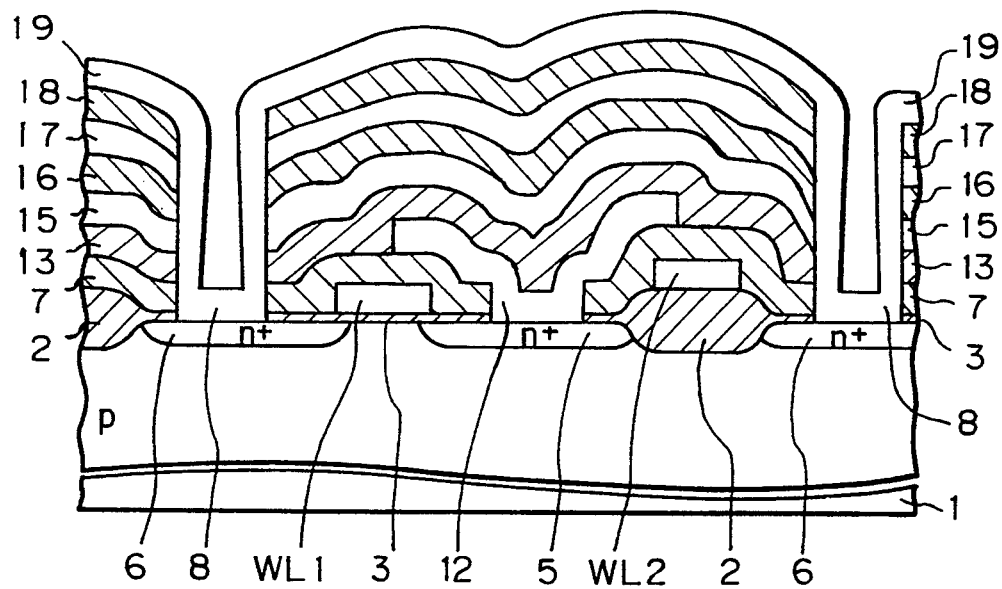

Referring to FIG. 14F:

A poly Si film 19 having a thickness of, e.g., 100 nm, is formed on the whole surface by a CVD process and then as impurities are doped into the film 19 by an ion-implantation process at a dose of $4 \times 10^{15}$ cm$^{-2}$, and an acceleration energy of 50 keV.

Since the impurities are doped into the poly Si film 19, 17 and 15 by the ion-implantation process, a heat-treatment must be carried out to activate the doped impurities. The heat-treatment can be performed after each of the ion-implantation processes or at a suitable intermediate step for all of the doped poly Si films.

Figure 14G:
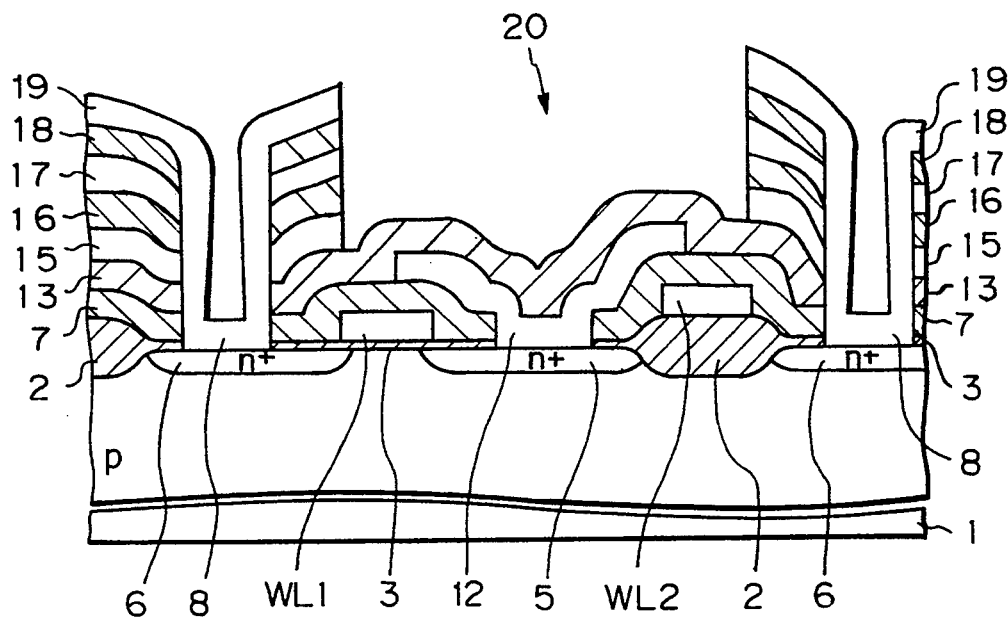

Referring to FIG. 14G:

The poly Si films 19, 17 and 15 and the SiO$_2$ films 18 and 16 are selectively etched to pattern the films into the storage electrode 8 and to form a groove 20, by a conventional photolithography technique including a resist process and a RIE process.

Figure 14H:
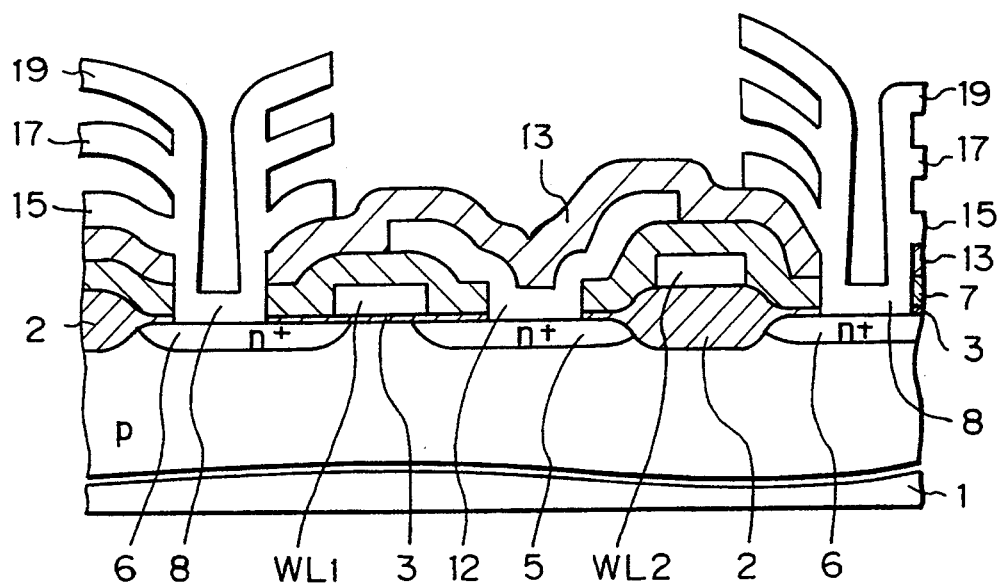
Figure 14:
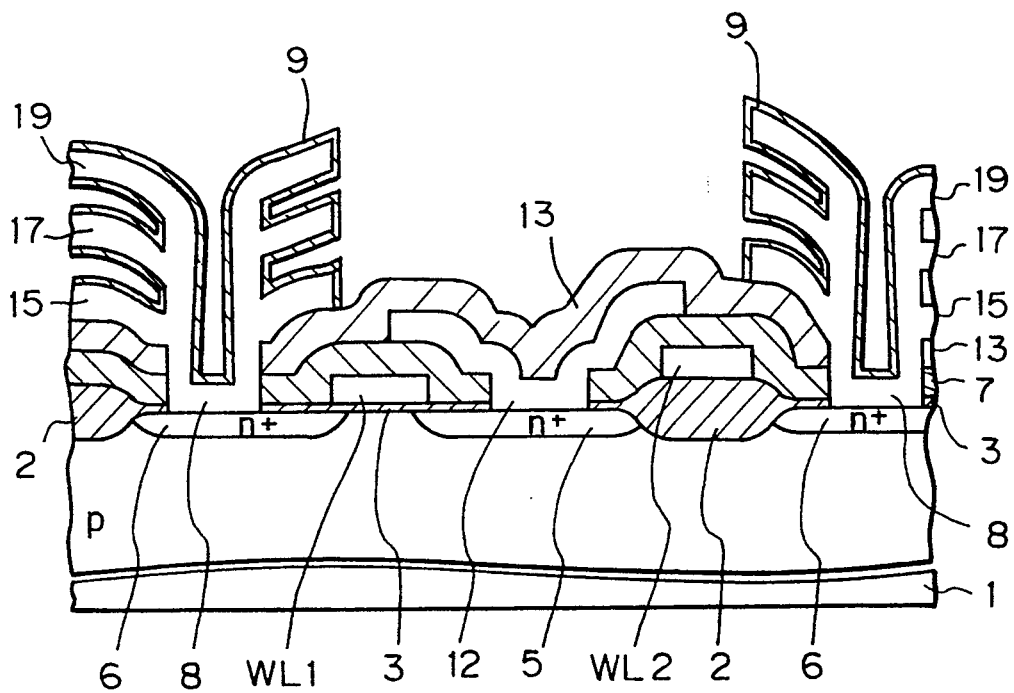
Figure 14:
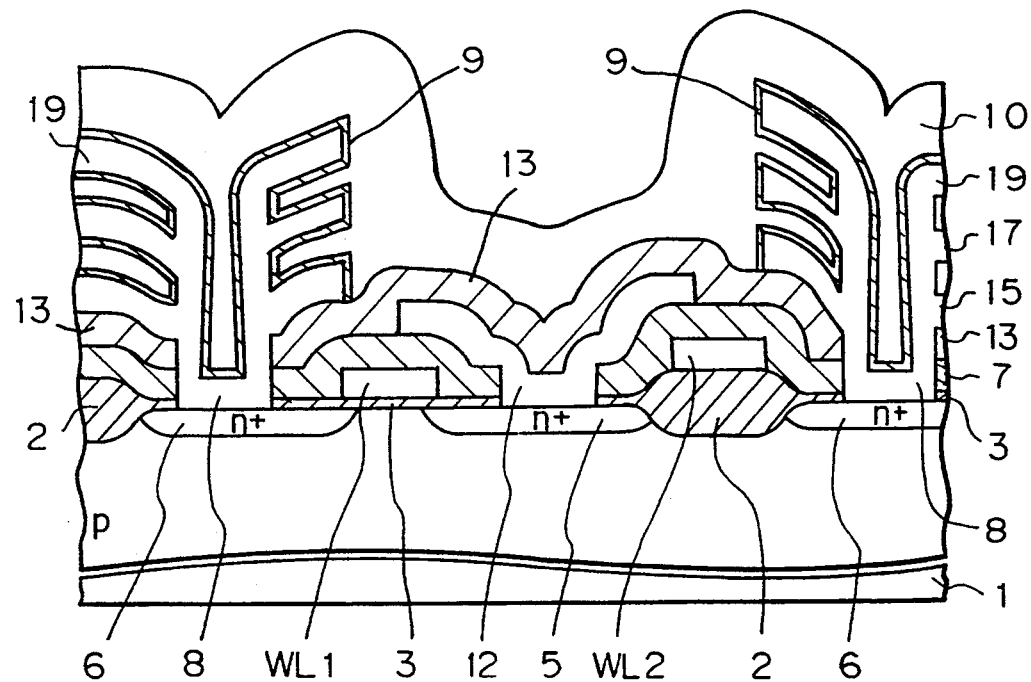

Referring to FIG. 14H:

The SiO$_2$ films 16 and 18 are removed (etched) by a wet etching process using an etchant of a hydrofluoric acid to form tree-like multilayer structure storage electrodes 8 of doped poly Si. In this case, the Si$_3$N$_4$ interlayer (film) is not etched by an etchant for SiO$_2$.

Referring to FIG. 14I:

The poly Si films 15, 17 and 19 are thermally oxidized to form an SiO$_2$ film of the dielectric film 9 thereon.

Referring to FIG. 14J:

A poly Si is deposited on the SiO$_2$ film 9 to form the opposite electrode 10 of the capacitor, by a CVD process. In this step, the poly Si fills the gaps between the film portions 15, 17 and 19 of the capacitor. Then P impurities are doped into the poly Si film (opposite electrode) 10 by a thermal diffusion process, to give a conductivity thereto.

Thereafter, in accordance with a conventional production technique, a passivation film (not shown), interconnection lines (not shown) of Al, bonding pads (not shown), or the like are formed, to complete the DRAM device having the tree-like multilayer stacked capacitors and the layout (arrangement) shown in FIGS. 12 and 13.

The DRAM device produced according to the present invention has a remarkably shorter bit line length, compared with the folded bit line system DRAM device with the stacked capacitor, and thus the bit line parasitic capacitance is reduced, with the result that the total power consumption is greatly lowered (e.g., by about one fourth) and the output signal voltage is greatly increased (e.g., approximately doubled), without losing the properties and functions of the DRAM device.

Figure 4:
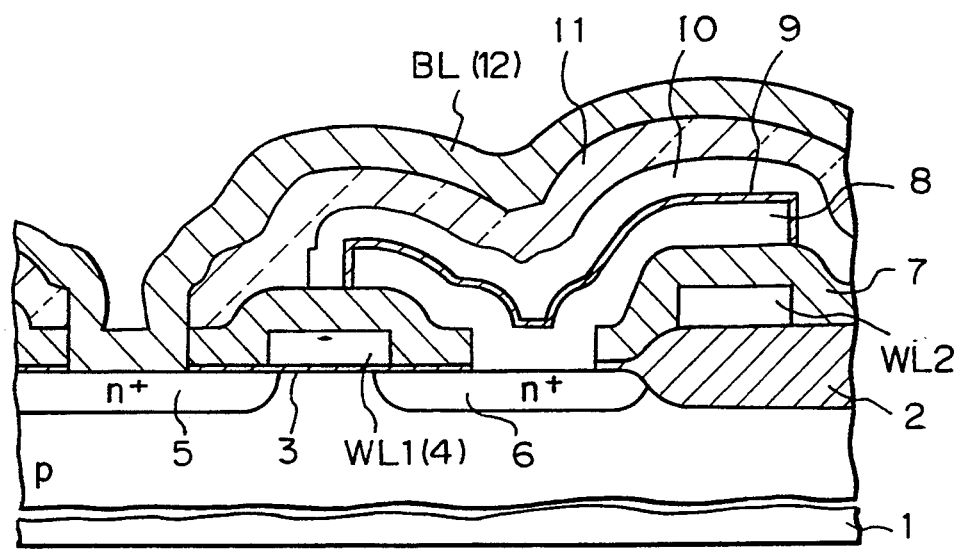
FIG. 4 is a schematic partial sectional view of the prior art DRAM taken along the line IV—IV of FIG. 3.
Figure 5:
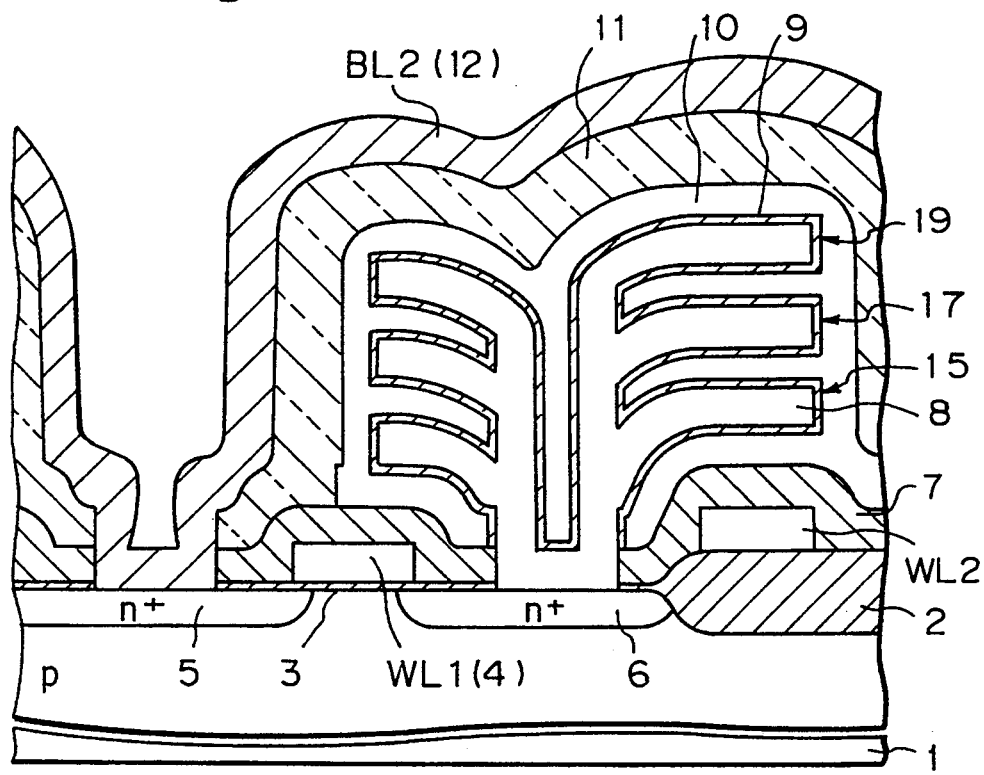
FIG. 5 is a schematic partial sectional view of a conventional folded bit line system DRAM device with a tree-like multilayer stacked capacitor.

It will be obvious that the present invention is not restricted to the above-mentioned embodiments and that many variations are possible for persons skilled in the art without departing from the scope of the invention. For example, it is possible to replace the memory cell of FIGS. 13 and 14J with the memory cell of FIG. 4.

I claim:

1. A dynamic random access memory device comprising:
   a sense amplifier;
   a bit line connected to said sense amplifier;
   a first group of dynamic memory cells periodically spaced apart by a predetermined spacing along a first row and connected to said bit line; and
   a second group of dynamic memory cells periodically spaced apart by said predetermined spacing along a second row which is substantially parallel to said first row and which is spaced from said first row by a predetermined pitch, said second group of dynamic memory cells being connected to said bit line, said first and second groups of dynamic memory cells being arranged side by side and adjacently to each other, and said first and second groups of dynamic memory cells being in staggered relationship to each other in the row direction;
   said bit line extending in a zigzag manner to alternately connect ones of said first and second groups of dynamic memory cells; said bit line crossing only a single word line between each pair of connected memory cells; said device being arranged as an open bit line system; said predetermined spacing comprises a memory cell pitch; and said first and second groups of dynamic memory cells are staggered apart relative to each other in a column direction such that they are shifted from adjacent ones in the other one of said first and second groups of dynamic memory cells by a half of the memory cell pitch; and wherein each of said dynamic memory cells comprises a capacitor and a transfer gate transistor having a gate electrode and first and second regions as source and drain regions;

said bit line is connected to the first region through a first contact hole formed in a first insulating layer which covers the gate electrode;

each said capacitor has a first electrode, connected to the second region through a second contact hole formed in the first insulating layer, and a second electrode formed over the first electrode via a second insulating layer; and the first contact hole corresponds to a first memory cell of the first group of memory cells and the second contact hole corresponds to a second memory cell of the second group of memory cells, which second memory cell is adjacent to the first memory cell in the column direction.

2. A dynamic random access memory device according to claim 1, wherein said capacitor has a tree-like multilayer structure comprising a storage electrode having fins, a dielectric film covering said storage electrode, and an opposite electrode covering said dielectric film.

3. A dynamic random access memory device according to claim 2, wherein each said storage electrode is formed after formation of said bit line, and wherein said word line is formed prior to the formation of said bit line.

* * * * *